United States Patent
Jung et al.

(10) Patent No.: US 7,567,465 B2
(45) Date of Patent: Jul. 28, 2009

(54) POWER SAVING SENSING SCHEME FOR SOLID STATE MEMORY

(75) Inventors: Chulmin Jung, Boise, ID (US); Kang Yong Kim, Boise, ID (US)

(73) Assignee: Micron Technology, Inc., Boise, ID (US)

(*) Notice: Subject to any disclaimer, the term of this patent is extended or adjusted under 35 U.S.C. 154(b) by 137 days.

(21) Appl. No.: 11/847,559

(22) Filed: Aug. 30, 2007

(65) Prior Publication Data
US 2009/0059707 A1    Mar. 5, 2009

(51) Int. Cl.
G11C 7/00    (2006.01)

(52) U.S. Cl. .................... 365/189.05; 365/189.02; 365/206; 365/207

(58) Field of Classification Search ............ 365/189.05, 365/189.02, 206, 207, 63
See application file for complete search history.

(56) References Cited

U.S. PATENT DOCUMENTS

| | | | |
|---|---|---|---|
| 5,423,047 A | 6/1995 | Leak | |
| 6,128,700 A * | 10/2000 | Hsu et al. | 711/122 |
| 6,134,180 A | 10/2000 | Kim et al. | |
| 6,279,090 B1 | 8/2001 | Manning | |
| 6,381,670 B1 | 4/2002 | Lee et al. | |
| 6,944,066 B1 | 9/2005 | Jing | |
| 7,085,182 B2 * | 8/2006 | Collura et al. | 365/201 |
| 7,095,644 B2 * | 8/2006 | Chevallier et al. | 365/148 |
| 7,152,167 B2 | 12/2006 | Kurts et al. | |
| 2006/0133158 A1 | 6/2006 | Shin | |
| 2007/0070796 A1 | 3/2007 | Kim | |
| 2007/0097753 A1 | 5/2007 | Choi | |

OTHER PUBLICATIONS

Korean Intellectual Property Office; "Notification of Transmittal of The International Search Report and Written Opinion of the International Searching Authority, or the Declaration", "Written Opinion of the International Search Authority", and "International Search Report" of corresponding International Patent Application No. PCT/US2008/073696, filed Aug. 20, 2008; Mar. 10, 2009; Daejeon, Republic of Korea.

* cited by examiner

*Primary Examiner*—Son Dinh
(74) *Attorney, Agent, or Firm*—Knobbe, Martens, Olson & Bear LLP

(57) ABSTRACT

Methods and apparatus are disclosed, such as those involving a solid state memory device. One such method includes selecting a plurality of memory cells in a memory array. States of a plurality of data bits stored in the selected plurality of memory cells are determined. In determining the states of the plurality of data bits, a portion of the plurality of data bits are sensed faster than others. The plurality of data bits are sequentially provided as an output. In one embodiment, the portion of the plurality of data bits includes the first bit of the sequential output of the memory device.

23 Claims, 6 Drawing Sheets

POWER SAVING SENSING SCHEME FOR SOLID STATE MEMORY

BACKGROUND OF THE INVENTION

1. Field of the Invention

Embodiments of the invention relate to solid state memory, and more particularly, in one or more embodiments, to dynamic random access memory.

2. Description of the Related Art

Solid state memory devices have been widely used as data storage in various electronic devices. Generally, solid state memory devices include volatile memories (e.g., dynamic or static random access memories) and non-volatile memories (e.g., read-only memories and flash memories).

Recently, the data processing speed of electronic devices such as a personal computer has been significantly improved. Thus, there has been a need for memory devices with a high data transfer rate which is compatible with such electronic devices. For certain memory devices, double data rate (DDR) schemes have been widely used for obtaining a high data rate during read or write operation. Memory devices using a DDR scheme transfer data on both the rising and falling edges of an external clock provided by an associated electronic device, effectively nearly doubling the data transfer rate. Examples of DDR schemes include DDR, DDR2, and DDR3.

The DDR schemes are typically combined with multi-bit prefetch schemes. Under the multi-bit prefetch schemes, for each of the data pins of a memory device, a plurality of bits of data are retrieved in parallel from a memory array in response to a single read command. The plurality of bits are stored in latch devices (or prefetch buffers) arranged in parallel. Then, the bits are multiplexed and output via the data pin on the rising and falling edges of an external clock issued from the associated electronic device. The numbers of bits prefetched in parallel under the DDR1, DDR2, and DDR3 schemes are 2, 4, and 8, respectively. A memory device using the DDR1 scheme prefetches 2 bits of data in parallel from memory cells in response to a single read command, and then outputs the 2 bits through a single data pin for a single external clock cycle. A memory device using the DDR2 scheme prefetches 4 bits of data in parallel from memory cells in response to a single read command, and then outputs the 4 bits through a single data pin for two external clock cycles. A memory device using DDR3 scheme prefetches 8 bits of data in parallel from memory cells in response to a single read command, and then outputs the 8 bits through a single data pin for three external clock cycles. Typically, the DDR2 scheme uses a higher external clock frequency than the DDR1 scheme. The DDR3 scheme typically uses a higher external clock frequency than the DDR2 scheme.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

As described above, there has been a need to provide memory devices with a high data transfer rate. In addition, there has been a need for memory devices with relatively low power consumption for use particularly in portable electronic devices, e.g., battery-powered devices.

A sense amplifier which determines the data state (either 0 or 1) of a memory cell in a memory device may affect the data transfer rate and the power consumption of the memory device. When a memory cell is read, a selected pair of digit lines couples the memory cell to a sense amplifier via a pair of interconnecting lines. The data state of the memory cell creates a voltage or current difference in the interconnecting lines.

A sense amplifier can typically be a voltage sense amplifier or a current sense amplifier. The voltage sense amplifier senses a voltage imbalance generated by the data state of a memory cell being read. On the other hand, the current sense amplifier detects a current imbalance created by the data state of a memory cell being read.

In one embodiment, a method of providing data from a plurality of memory cells in a memory device includes using more power for determining a portion of the data than for determining the remaining portion of the data. In one embodiment, a plurality of sense amplifiers are arranged in parallel to detect the data states of the plurality of memory cells. Some of the sense amplifiers can be provided with more power than the others. The other sense amplifiers may be provided with relatively low power.

In one embodiment, the sense amplifiers are current sense amplifiers. In such an embodiment, a current sense amplifier for detecting, for example, a first bit of the data is provided with a greater bias current than the other current sense amplifiers. This configuration allows the sense amplifiers with the greater bias current to detect the first bit at a faster rate than the rest of the bits. Because the other bits have a speed margin of at least a half clock cycle, operating the other current sense amplifiers at a slower speed does not significantly affect the overall data transfer rate of the memory device. In addition, because only the first bit is detected with a boosted bias current while the other bits are detected with a reduced bias current, the overall power consumption of the memory device can be lowered.

Figure 1:
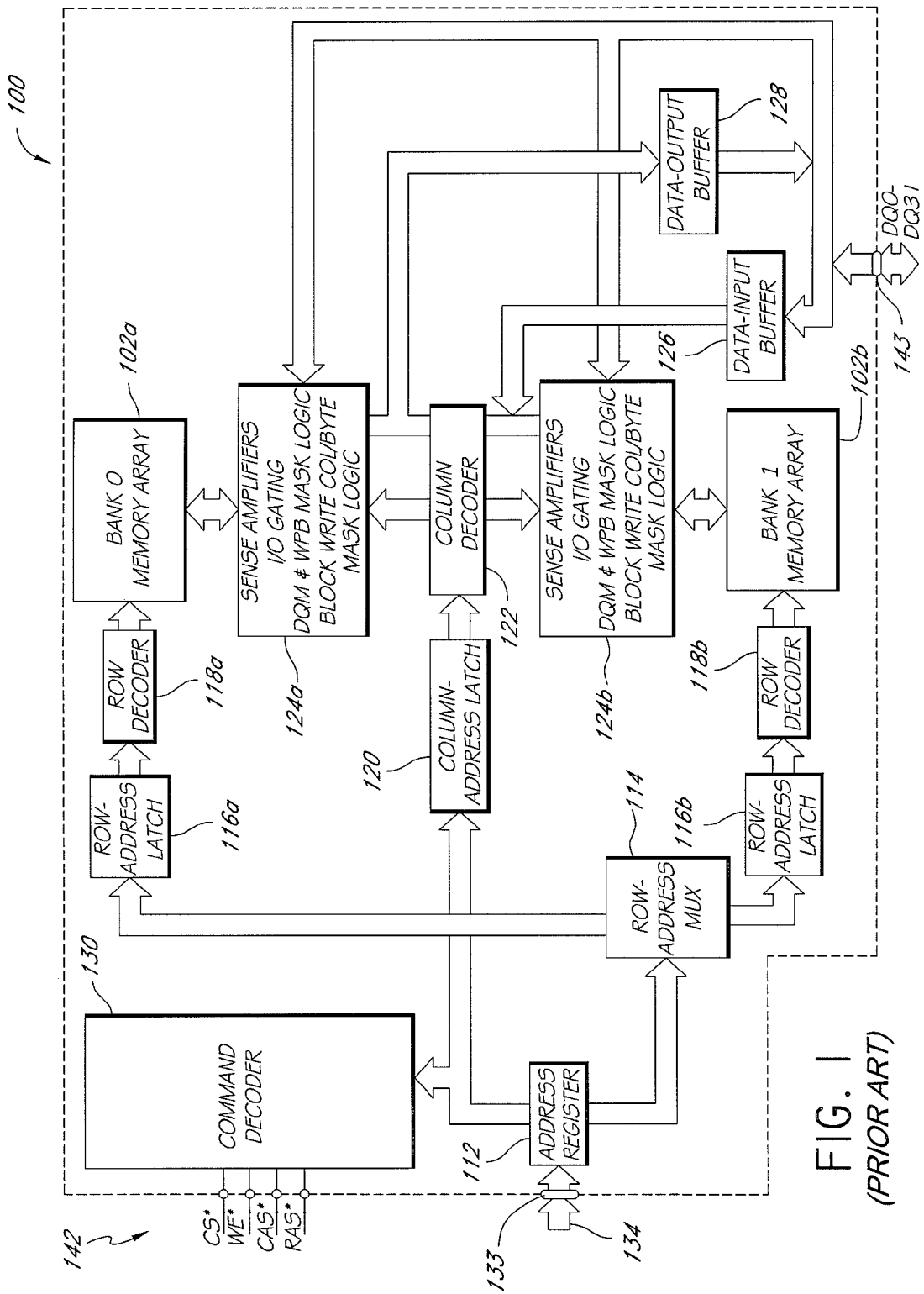
FIG. 1 is a block diagram of a memory device according to one embodiment.

FIG. 1 is a block diagram of a memory device 100. The illustrated memory device is a DRAM. A skilled artisan will, however, appreciate that the principles and advantages described herein are applicable to other types of memory devices The memory device 100 includes a memory array to store data. The memory array includes a plurality of memory banks 102a, 102b. Each of the memory banks 102a, 102b includes an array of memory cells arranged in rows and columns.

The memory device 100 also includes an address register 112, a row address multiplexer 114, row address latches 116a, 116b, and row decoders 118a, 118b. The row address latches 116a, 116b, and the row decoders 118a, 118b are typically associated with the respective memory banks 102a, 102b. The memory device 100 also includes a column address latch 120, a column decoder 122, a command decoder 130, and an address input 133. The memory device 100 further includes column circuits 124a, 124b typically associated with the respective memory banks 102a, 102b. The memory device 100 also includes a data input buffer 126 and a data output buffer 128.

The address input 133 receives address signals and bank address signals from an associated electronic device through an address bus 134. Typically, the address register 112 initially receives a row address and provides it to the row address multiplexer 114. The row address multiplexer 114 provides the row address to a selected one of the row address latches 116a, 116b, according to the state of the bank address signals. The selected row address latch provides the row address to an associated row decoder. The row decoder 118a or 118b applies various signals to the associated memory bank, thereby accessing a selected row address.

The address register 112 also receives a column address through the address input 133, and provides it to the column address latch 120. The column address latch 120 provides the column address to the column decoder 122, according to the state of the bank address signals. The column decoder 122 provides the column address to a selected one of the column circuits 124a, 124b. The selected column circuit provides signals to a selected one of the memory banks 102a, 102b to access a selected memory cell in the selected memory bank. During a write mode, data can be input to the selected memory cell through the data input buffer 126 via a data port 143. The data port 143 can include a plurality of data pins DQ0-DQ31. Alternatively, during a read mode, data can be output from the selected memory cell through the data output buffer 128 via the data port 143. During a read mode, the data state of a memory cell being read is sensed and amplified by a sense amplifier which is part of the column circuits 124a, 124b. The sense amplifier can be, for example, a voltage sense amplifier or a current sense amplifier as described above. The command decoder 130 serves to control the operations of the memory device 100 upon receiving various signal, including a chip select signal CS#, a write enable signal WE#, a column address strobe signal CAS#, and a row address strobe signal RAS#.

Figure 2:
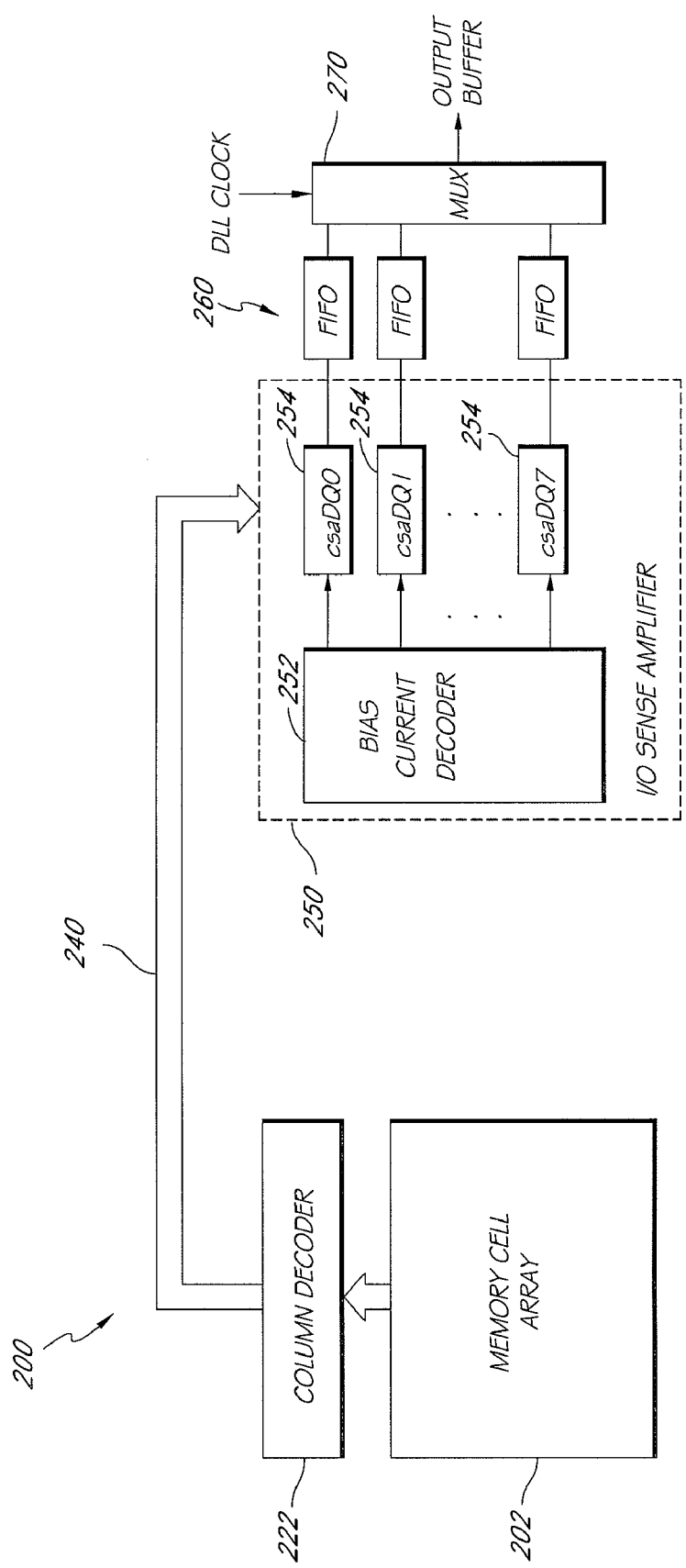
FIG. 2 is a block diagram of a data path of a memory device according to one embodiment.

With reference to FIG. 2, one embodiment of an input/output (I/O) sense amplifier 250 for a solid state memory device 200 will now be described. The illustrated sense amplifier 250 includes a plurality of current sense amplifiers 254. In other embodiments, the I/O sense amplifier can include a plurality of voltage sense amplifiers.

In FIG. 2, the memory device 200 includes a memory array 202, a column decoder 222, an interconnecting bus 240, an I/O sense amplifier 250, latch devices (or prefetch buffers) 260, and a multiplexer 270. Other components of the memory device 200 are omitted for the sake of clarity.

During a read operation, a plurality of pairs of digit lines (not shown) are selected by the column decoder 222. Each of the pairs of digit lines couples a respective one of selected memory cells in the memory array 202 to the I/O sense amplifier 250. The I/O sense amplifier 250 is configured to detect the data states of the selected memory cells, and converts the data states into voltage differences representing the data states. The latch devices 260 temporarily store the voltage differences as digital data on a first-input-first-output (FIFO) basis. The multiplexer 270 is configured to provide the digital data to a data output buffer (not shown) of the memory device 200 in synchronization with a delayed locked loop (DLL) clock from a DLL system incorporated in the memory device 200. The DLL system serves to synchronize the data provision from the memory device with an external clock issued from an associated electronic device.

In the illustrated embodiment, the I/O sense amplifier 250 includes a bias current decoder and a plurality of current sense amplifiers 254. The total number of current sense amplifiers 254 can vary depending on the number of the selected memory cells, i.e., prefetched data bits, in the memory device 200. For example, a DDR1 memory device having 2 prefetched bits can have two current sense amplifiers. A DDR2 memory device (4 prefetched bits) can have four current sense amplifiers. A DDR3 memory device (8 prefetched bits) can have eight current sense amplifiers. A skilled artisan will, however, appreciate that the total number of current sense amplifiers can vary widely depending on the configuration of the memory device 200. Each of the current sense amplifiers 254 is coupled to a respective one of the latch devices 260.

Figure 3:
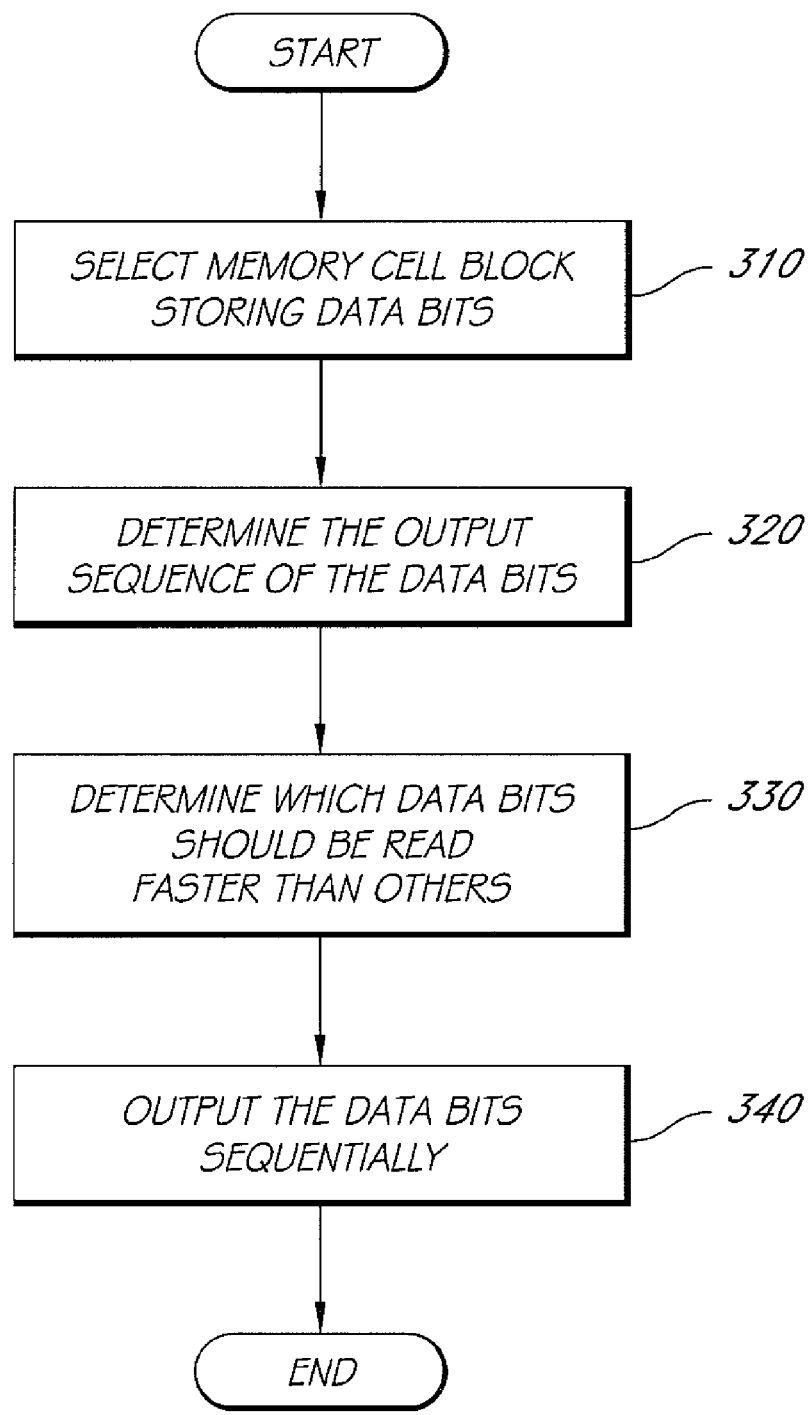
FIG. 3 is a flowchart illustrating a method of providing data in a memory device according to one embodiment.

Referring to FIG. 3, a method of providing data from a memory device will now be described in detail. The method can be performed by, for example, the column circuits 124a, 124b of FIG. 1. In other embodiments, two or more of the blocks of FIG. 3 can be combined with one another. At least one of the blocks can be omitted in some arrangements. In addition, additional blocks can be added to the flowchart of FIG. 3.

At block 310, upon receiving a read signal and row and column address signals from an associated electronic device, a memory device selects memory cells to be read. Under a DDR scheme, a plurality of memory cells are selected by the address signals. The column address signals may also include a code indicative of an output sequence of data bits stored in the selected memory cells. The data bits will be output sequentially via a single data pin of the memory device according to the sequence.

At block 320, the output sequence of the data bits is determined at least partially based on the code indicative of the output sequence. In one embodiment, the first bit to be output is identified for use at block 330. In other embodiments, a first few (e.g., second, third, and fourth bits) are identified for use at block 330.

At block 330, the data bits stored in the selected memory cells are determined using, for example, current sense amplifiers. In one embodiment, two currents flowing via interconnecting lines from each of the memory cells are detected. A difference between the two currents is used to determine the data state of the memory cell, thereby providing an indication of whether the state of the data bit stored in the memory cell is 0 or 1. In other embodiments, a voltage difference generated by the data state of the memory cell may also be used to determine the data bit. In the illustrated embodiment, more power is used to determine the first bit than the later bits. When more power is used, the current difference generated by the memory cell can be amplified faster than otherwise. Thus, this configuration allows the first bit to be determined faster than the other bits.

At block 340, the data bits are output sequentially via one of data pins of the memory device. When the data bits are output, the first bit is output first. Thus, the faster determination of the first bit can improve the data transfer rate of the memory device. Because the other data bits are queued to be output after the first bit, these data bits can be determined at a relatively slower rate, i.e., with less power consumption without affecting the overall data transfer rate.

Figure 4:
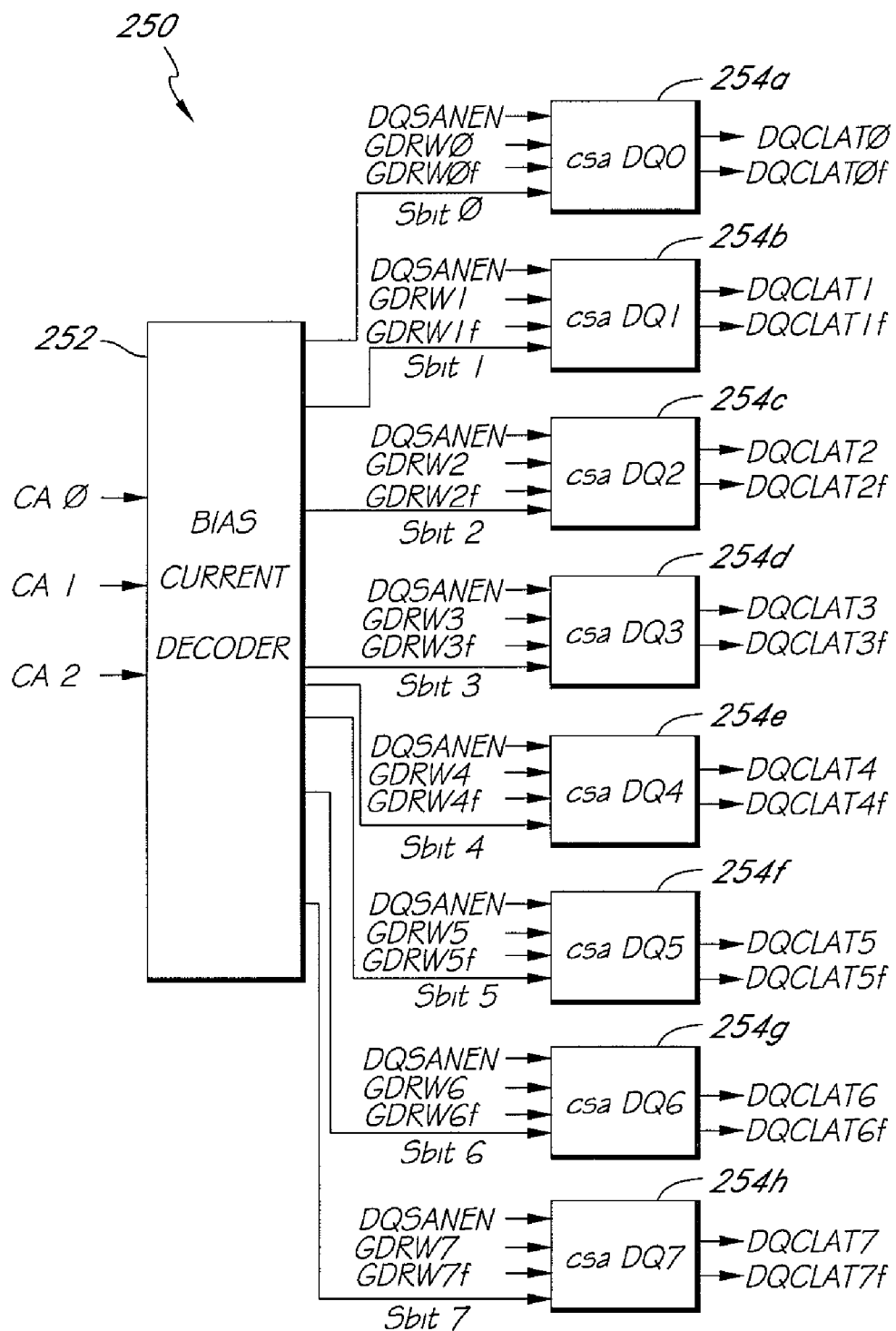
FIG. 4 is a block diagram of the I/O sense amplifier of FIG. 2, according to one embodiment.

With reference to FIG. 4, the details of one embodiment of the I/O sense amplifier 250 will now be described. The bias current decoder 252 is configured to receive and decode column address signals CA0-CA2 which indicate an output sequence of a plurality of bits being output. The memory device 200 (FIG. 2) may receive additional current address signals (not shown) for selecting a plurality of memory cells in which the plurality of bits are stored. In the illustrated embodiment, DDR3 is employed, and thus 8 bits of data are provided in parallel from the selected memory cells. The 8 bits will be multiplexed into a single data stream.

The illustrated bias current decoder 252 is configured to determine which current sense amplifier is to detect the first bit in the output sequence among the 8 bits. Then, the bias current decoder 252 generates selection bit signals Sbit0-Sbit7. Among the selection bit signals Sbit0-Sbit7, one signal is activated to indicate to the corresponding current sense amplifier to use a greater bias for faster operation while the other selection bit signals can remain unchanged for default low power operation. In one embodiment, the selection bit signals are initially at a low (L) level. A selection signal for the sense amplifier which will detect the first bit goes to a high (H) level while the other selection signals remain at the low level. In another embodiment, the selection bit signals are initially at a high (H) level. A selection signal for the sense amplifier which will detect the first bit goes to a low (L) level while the other selection signals remain at the high level.

Each of the current sense amplifiers 254a-254h is configured to receive a data sense amplifier enable signal DQSANEN, a respective one of global data read write (GDRW) signals GDRW0-GDRW7, a respective one of inverse global data read write (GDRWf) signals GDRW0f-GDRW7f, and a respective one of the selection bit signals Sbit0-Sbit 7. Each of the current sense amplifiers 254a-254h is configured to detect a current imbalance between the GDRW signal and the GDRWf signal, which reflects the data state of the memory cell being read. The current sense amplifiers 254a-254h provide data current latch signals DQCLAT0-DQCLAT7 and inverse data current latch signals DQCLAT0f-DQCLAT7f as outputs. Voltage differences between pairs of the data current latch signals DQCLAT0-DQCLAT7 and the inverse data current latch signals DQCLAT0f-DQCLAT7f are temporarily stored at the latch devices 260 (FIG. 2).

In the illustrated embodiment, a sense amplifier which is to determine the first bit of the output sequence is configured to boost its bias current flowing therethrough while the other sense amplifiers use a bias current substantially lower than the bias current for determining the first bit. In one embodiment, the bias current for determining the other bits may be from about 30% to about 70% of the bias current for determining the first bit. The stronger bias current for the first bit permits the corresponding current sense amplifier to perform a faster determining operation, thereby providing the state of the first bit faster. Because the other bits are output sequentially after the first bit, the rates for determining the other bits may not significantly affect the overall data transfer rate. Thus, the other bits can be determined using a bias current lower than the bias current for the first bit for reduced power. A skilled artisan will, however, appreciate that a first few (e.g., second, third, and fourth) bits can be determined using a higher bias current while the other bits are determined with a lower bias current, depending on the configuration of the memory device.

Figure 5:
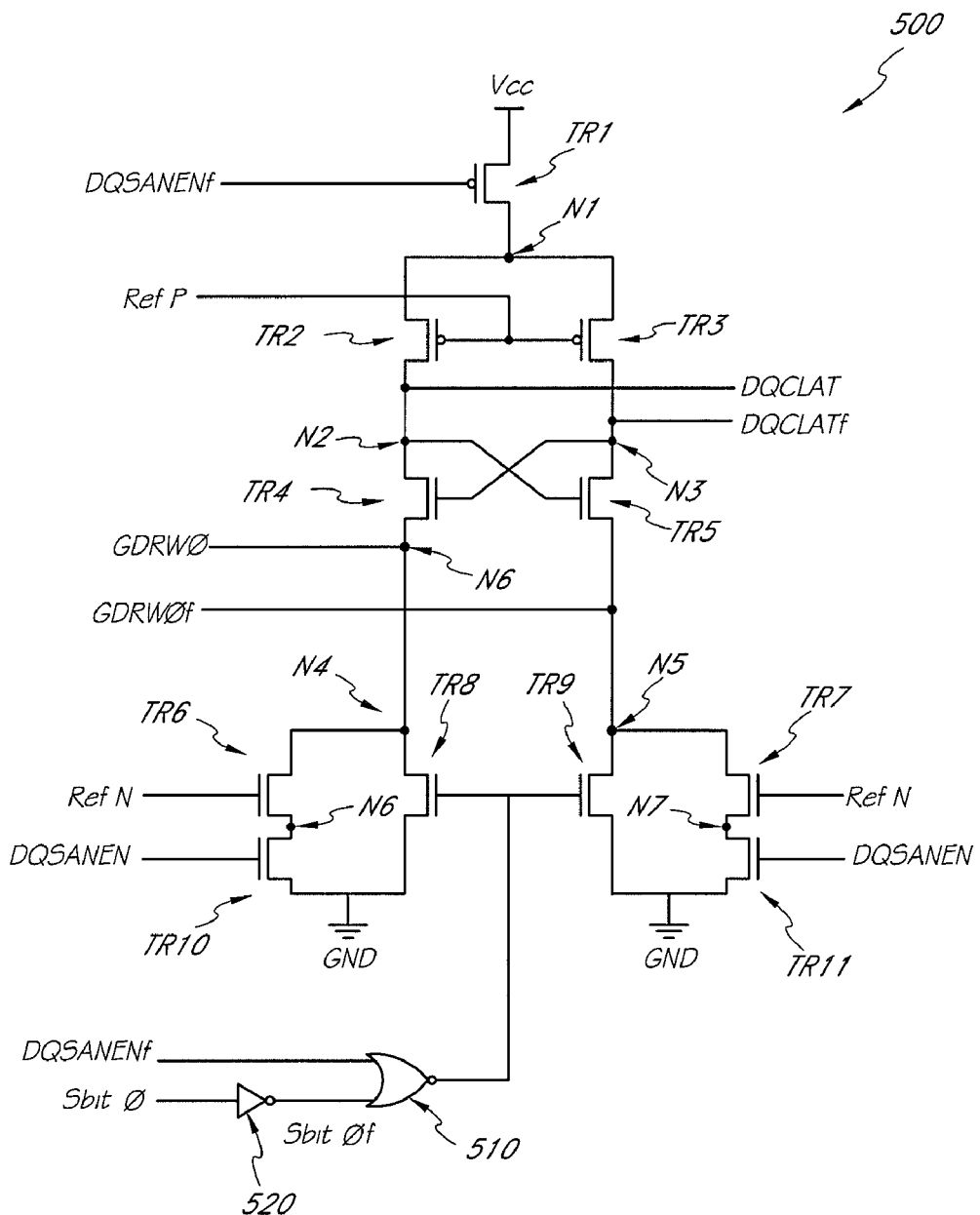
FIG. 5 is a circuit diagram of a current sense amplifiers according to one embodiment.

FIG. 5 illustrates a circuit diagram of one embodiment of a current sense amplifier. The illustrated current sense amplifier 500 can be the first current sense amplifier csaDQ0 of FIG. 4 which is configured to receive a first selection bit Sbit0. The first selection bit Sbit0 is activated to indicate to the first current sense amplifier to use a greater bias for faster operation. However, the other sense amplifiers csaDQ1-csaDQ7 in FIG. 4 can have the same configuration except that each of the other sense amplifiers receives a corresponding one of the selection bit signal Sbit1-Sbit7.

The current sense amplifier 500 includes first to eleventh transistors TR1-TR11, a NOR gate 510, an inverter 520, and first to seventh nodes N1-N7. The second transistor TR2, the fourth transistor TR4, and the sixth transistor TR6 together form a first bias current path. The third transistor TR3, the fifth transistor TR5, and the seventh transistor TR7 together form a second bias current path. In the illustrated embodiment, the first to third transistors TR1-TR3 are PMOS transistor. The fourth to eleventh transistor TR4-TR11 are NMOS transistors. A skilled artisan will, however, appreciate that the transistors TR1-TR11 can be of an opposite type depending on the configuration of the sense amplifier.

The first transistor TR1 is coupled between a voltage source Vcc and the first source N1. The gate of the first transistor TR1 is configured to receive an inverse data sense amplifier enable signal DQSANENf.

The second transistor TR2 is coupled between the first node N1 and the second node N2. The third transistor TR3 is coupled between the first node N1 and the third node N3. The gates of the second and third transistors TR2, TR3 are configured to receive a P reference signal refP. Each of the second and third transistors TR2, TR3 serve to provide a load along a respective one of the first and second bias current paths.

The fourth transistor TR4 is coupled between the second node N2 and the fourth node N4. The fifth transistor TR5 is coupled between the third node N3 and the fifth node N5. The fourth and fifth transistors TR4, TR5 are cross-coupled to each other. The gate of the fourth transistor TR4 is coupled to the third node N3. The gate of the fifth transistor TR5 is coupled to the second node N2. The fourth and fifth transistors TR4, TR5 serve to amplify a current difference between a global data read write (GDRW0) signal and an inverse global data read write (GDRW0f) signal from a selected memory cell.

The sixth transistor TR6 is coupled between the fourth node N4 and the sixth node N6. The seventh transistor TR7 is coupled between the fifth node N5 and the seventh node N7. The gates of the sixth and seventh transistors TR6, TR7 are configured to receive an N reference signal refN.

The eighth transistor TR8 is coupled between the fourth node N4 and ground GND. The ninth transistor TR9 is coupled between the fifth transistor N5 and ground GND. The gates of the eighth and ninth transistors TR8, TR9 are configured to receive an output signal from the NOR gate 510.

The tenth transistor N10 is coupled between the sixth transistor N6 and ground GND. The eleventh transistor N11 is coupled between the seventh node N7 and ground GND. The gates of the tenth and eleventh transistors TR10, TR11 are configured to receive a data sense amplifier enable signal DQSANEN.

The NOR gate 510 is configured to receive the inverse data sense amplifier enable signal DQSANENf and an inverse selection bit signal Sbit0f from the inverter 520. The NOR gate 510 outputs a signal to the gates of the eighth and ninth transistors TR8, TR9. The inverter 520 is configured to receive a selection bit signal Sbit0, and output an inverse selection bit signal Sbit0f to one of the inputs of the NOR gate 510.

The GDRW0 signal and the GDRW0 f signal are provided to the fourth node N4 and the fifth node N5, respectively. The GDRW0 and GDRW0 f signals together serve to carry currents indicative of the data state of a memory cell being read during a read operation. The fourth transistor TR4 and the fifth transistor TR5 detects an imbalance between the currents, and amplifies the imbalance.

A data current latch signal DQCLAT and an inverse data current latch signal DQCLATf are output from the second and third nodes N2, N3, respectively. The DQCLAT and DQCLATf signals together serve to provide a voltage difference which is provided to an associated latch device (prefetch buffer) of the memory device. The voltage difference is temporarily stored as a digital data bit in the latch device.

Figure 6:
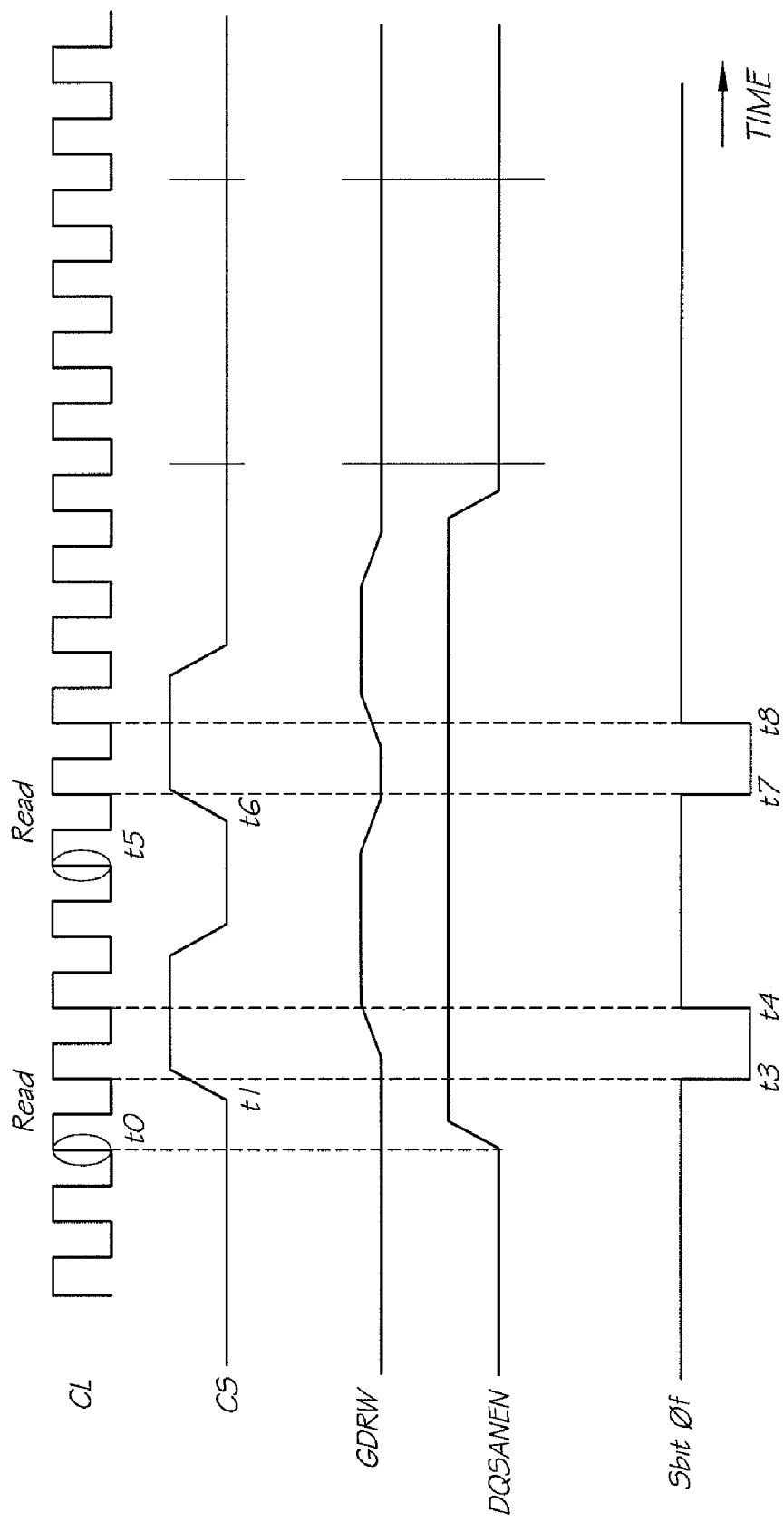
FIG. 6 is a timing chart illustrating the operation of the current sense amplifier of FIG. 5 according to one embodiment.

Referring to FIGS. 5 and 6, the operation of the current sense amplifier 500 will now be described. In FIG. 6, a read signal is issued to the memory device from an associated electronic device on a rising edge of a clock signal CL at time t0. Upon receiving the read signal, a data sense amplifier enable signal DQSANEN goes high immediately after time t0. Accordingly, the inverse data sense amplifier enable signal DQSANENf goes low. Thus, the first, the tenth, and the eleventh transistors TR1, TR10, TR11 are turned on. In addition, the P reference signal RefP goes low, thereby turning on the second and third transistors TR2, TR3. The N reference signal RefN goes high, thereby turning on the sixth and seventh transistors TR6, TR7. Thus, a bias current flows through the first transistor TR1, the second transistor TR2, the fourth transistor TR4, the sixth transistor TR6, and the tenth transistor TR10 to ground GND (along the first bias current path). Another bias current flows through the first transistor TR1, the third transistor TR3, the fifth transistor TR5, the seventh transistor TR7, and the eleventh transistor TR11 to ground GND (along the second bias current path).

Referring back to FIG. 6, a column strobe signal is provided to the memory device at time t1. In addition, a column address signal is provided to the memory device. In the illustrated embodiment in which DDR3 is employed, the column address signal may include column address bits CA0-CA2 indicative of the sequence of data bits to be output. The bias current decoder 252 (FIG. 4) decodes the column address bits CA0-CA2 and provides selection bit signals Sbit0-Sbit7 to the plurality of current sense amplifiers csaDQ0-csaDQ7 (FIG. 4). In FIG. 6, the first current sense amplifier csaDQ0 is configured to determine the first bit in the sequence. The bias current decoder 252 provides corresponding selection bit signals to the plurality of current sense amplifiers csaDQ0-csaDQ7.

In the illustrated embodiment (FIG. 6), the first selection bit signal Sbit0 goes from low to high at time t3, and thus the inverse first selection bit signal Sbit0f shown in FIG. 6 goes from high to low. Because the NOR gate 410 now receives low signals at both of its inputs, the output of the NOR gate 410 goes high, thereby turning on the eighth and ninth transistors TR8, TR9. At time t4, the inverse first selection bit signal Sbit0 goes from low to high, thereby turning off the eighth and ninth transistors TR8, TR9.

Between time t3 and t4, the GDRW0 and GDRW0f signals transition according to the state of the memory cell being read. These signals create an imbalance between the currents flowing through the fourth transistor TR4 and the fifth transistor TR5. Because the eight and ninth transistors TR8, TR9 are turned on, more currents can flow down to ground GND than otherwise. This creates a detectable current difference at a faster rate. However, more power is consumed because more bias currents flow through the current sense amplifier 500. In this manner, the first bit can be determined at a faster rate with more power consumption than when the eight and ninth transistors TR8, TR9 are not turned on. Upon receiving another read signal at time t5, the column strobe signal, the DQSANEN signal, and the Sbit0 signal transition in the same manner. Between time t7 and t8, a GDRW signal from another memory cell is read using a boosted bias current.

While the first bit in the sequence is determined in the manner described above, the subsequent bits in the sequence are determined without turning on the corresponding eighth and ninth transistors TR8, TR9. Thus, less currents flow through the corresponding current sense amplifiers, thereby reducing power consumption. This allows the overall power consumption to be reduced by, for example, at least 40%, compared to using the same power for detecting all data bits. As mentioned earlier, because the subsequent bits are output later than the first bit, they may not significantly affect the data transfer rate of the read operation. Therefore, the configuration of the I/O sense amplifier described above can provide a faster read operation at lower power consumption.

In the illustrated embodiment, only the first bit is determined with more power while the subsequent bits are determined with less power. In other embodiments, two or more, but less than all of the bits can be determined with more power while the remaining bits are determined with less power, depending on the design of the memory device.

The embodiments above are described in the context of a memory device using current sense amplifiers. A skilled artisan will, however, appreciate that the method of using biasing power unequally for determining data bits in memory cells can be adapted for use with a memory device using voltage sense amplifiers.

A memory device with the power scheme described above can be incorporated in various electronic devices. Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, etc. Further, the electronic device can include unfinished products.

One embodiment is a method of providing data in an integrated circuit. The method includes receiving a request for data. The request corresponds to a first group and a second group. The method also includes pre-fetching one or more data bits of a first group and one or more data bits of a second group, using a faster sensing technique for the first group than for the second group. The method further includes providing the one or more data bits of the first group earlier than the one or more data bits of the second group.

Another embodiment is an apparatus including an integrated circuit. The apparatus includes an array of memory cells; a sensing circuit configured to determine states of a plurality of data bits stored in a selected plurality of the memory cells; and a latch circuit configured to store and output the plurality of data bits sequentially. The sensing circuit is configured to determine one or more of the data bits faster than the others of the data bits.

Yet another embodiment is a solid state memory device. The device includes a memory array; a plurality of data pins for data input/output for the memory array; a plurality of sense amplifiers arranged in parallel to one another. The sense amplifiers are configured to determine states of a plurality of bits stored in the memory array. The sense amplifiers are configured to be switchable between a first mode and a second mode in determining the states of the bits stored in the memory array. The first mode uses more power than the second mode. The device also includes a plurality of latches arranged in parallel to one another. The latches are configured to store the plurality of bits. The device further includes a multiplexer configured to sequentially output the plurality of bits via one of the data pins.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

We claim:

1. A method of providing data in an integrated circuit, the method comprising:
   receiving a request for data, the request corresponding to a first group and a second group;
   pre-fetching one or more data bits of a first group and one or more data bits of a second group, using a faster sensing technique for the first group than for the second group; and
   providing the one or more data bits of the first group earlier than the one or more data bits of the second group.

2. The method of claim 1, wherein providing the one or more data bits of the first group earlier than the one or more bits of the second group comprises sequentially providing the data bits of the first and second groups.

3. The method of claim 2, wherein sequentially providing the data bits of the first and second groups comprises providing a first bit first among the data bits, wherein the one or more of the data bits of the first group include the first bit.

4. The method of claim 1, wherein pre-fetching the one or more data bits of the first group and the one or more data bits of the second group comprises using a lower power sensing technique for the second group than for the first group.

5. The method of claim 4, wherein pre-fetching the one or more data bits of the first group and the one or more data bits of the second group comprises using a bias current, wherein using a faster sensing technique comprises providing a greater bias current for the first group than for the second group.

6. The method of claim 1, wherein pre-fetching the one or more data bits of the first group and the one or more data bits of the second group comprises pre-fetching the data bits of the first and second groups in response to a single request for data.

7. The method of claim 1, wherein receiving the request for data comprises receiving the request at a dynamic random access memory (DRAM) comprising a memory array, wherein pre-fetching the data bits comprises pre-fetching the data bits from the memory array.

8. The method of claim 1, wherein pre-fetching the one or more data bits of the first group and the one or more data bits of the second group comprises determining which one of the first and second groups is to be pre-fetched using the faster sensing technique at least partially based on the request for data.

9. An apparatus comprising an integrated circuit which comprises:
   an array of memory cells;
   a sensing circuit configured to determine states of a plurality of data bits stored in a selected plurality of the memory cells; and
   a latch circuit configured to store and output the plurality of data bits sequentially;
   wherein the sensing circuit is configured to determine one or more of the data bits faster than the others of the data bits.

10. The device of claim 9, wherein the sensing circuit is configured to provide a bias current to determine the state of each of the selected plurality of memory cells, wherein the sensing circuit is configured to provide a greater bias current for determining the one or more of the data bits than for determining the others of the data bits.

11. The device of claim 9, wherein the integrated circuit is configured to provide a column address signal indicative of the locations of the selected plurality of memory cells in the array, wherein the sensing circuit is configured to identify the one or more of the data bits among the plurality of data bits at least partially based on the column address signal.

12. The device of claim 9, wherein the latch circuit is configured to output a first data bit first among the plurality of data bits, wherein the one or more of the data bits include the first data bit.

13. The device of claim 12, wherein the sensing circuit comprises:
   a decoder configured to decode a column address signal to identify the first data bit to be output from the memory device among the plurality of data bits and output decoded signals; and
   a plurality of sense amplifiers configured to provide more power for determining the first data bit than for determining the other data bits at least partially in response to the decoded signals.

14. The device of claim 13, wherein the plurality of sense amplifiers are current sense amplifiers.

15. The device of claim 13, wherein the latch circuit further comprises:
   a plurality of latch devices, each of the latch devices being configured to store a respective one of the plurality of data bits; and
   a multiplexer configured to sequentially provide the plurality of data bits stored in the latch devices.

16. The device of claim 9, wherein the memory device is configured to output the plurality of data bits in synchronization with rising and falling edges of an external clock.

17. The device of claim 16, wherein the memory device is one of a Double Data Rate 1 (DDR1) memory device, a Double Data Rate 2 (DDR2) device, or a Double Data Rate 3 (DDR3) device.

18. A solid state memory device, comprising:
   a memory array;
   a plurality of data pins for data input/output for the memory array;
   a plurality of sense amplifiers arranged in parallel to one another, the sense amplifiers being configured to determine states of a plurality of bits stored in the memory array, wherein the sense amplifiers are configured to be switchable between a first mode and a second mode in determining the states of the bits stored in the memory array, the first mode using more power than the second mode;
   a plurality of latches arranged in parallel to one another, the latches being configured to store the plurality of bits; and
   a multiplexer configured to sequentially output the plurality of bits via one of the data pins.

19. The device of claim 18, wherein the multiplexer is configured to output a first bit first among the plurality of bits, wherein one of the sense amplifiers is configured to be switched to the first mode to determine the first bit.

20. The device of claim 19, wherein each of the sense amplifiers is configured to provide a bias current in determining the bits, wherein the one of the sense amplifiers is configured to provide a greater bias current than the others of the sense amplifiers.

21. The device of claim 18, wherein the memory device is configured to receive a column address signal from an associated electronic device, a portion of the column address signal being indicative of an output sequence of the plurality of bits, wherein the memory device further comprises a bias current decoder configured to identify the first bit to be output among the plurality of bits by decoding the portion of the column address signal.

22. The device of claim 18, wherein the memory device is a dynamic random access memory (DRAM).

23. The device of claim 22, wherein the memory device is a Double Data Rate 1 (DDR1) DRAM, a Double Data Rate 2 (DDR2) DRAM, or a Double Data Rate 3 (DDR3) DRAM.

* * * * *